United States Patent [19]
Fullman et al.

[11] Patent Number: 5,818,252
[45] Date of Patent: Oct. 6, 1998

[54] REDUCED OUTPUT TEST CONFIGURATION FOR TAPE AUTOMATED BONDING

[75] Inventors: Edward Carl Fullman, Phoenix; Richard Brian Nelson, Chandler; James Richard Kozicek, Mesa; Richard Alexander Erhart, Chandler, all of Ariz.

[73] Assignee: Vivid Semiconductor, Inc., Chandler, Ariz.

[21] Appl. No.: 715,896

[22] Filed: Sep. 19, 1996

[51] Int. Cl.$^6$ ................................................. G01R 31/26
[52] U.S. Cl. ............................................................ 324/765
[58] Field of Search .................................. 324/765, 763; 371/22.5, 22.6

[56] References Cited

U.S. PATENT DOCUMENTS

| | | | |
|---|---|---|---|
| 4,918,385 | 4/1990 | Shreeve | 371/22.6 |
| 5,132,614 | 7/1992 | Sakumoto et al. | 324/763 |
| 5,150,047 | 9/1992 | Saito et al. | 324/537 |
| 5,418,470 | 5/1995 | Dagostino et al. | 324/763 |
| 5,528,256 | 6/1996 | Erhart et al. | 345/96 |

OTHER PUBLICATIONS

*Surface Mount Technology*, Vardaman, IEEE Press, 1993, pp. 165–230. (Month Unavailable).

*Primary Examiner*—Josie Ballato
*Assistant Examiner*—Russell M. Kobert
*Attorney, Agent, or Firm*—Cahill, Sutton & Thomas, P.L.C.

[57] ABSTRACT

An integrated circuit assembly using tape automated bonding (TAB) reduces the number of TAB test pads formed upon the TAB film, for purposes of testing the integrated circuit prior to surface mounting, by sharing at least some of such test pads between at least two output terminals of the integrated circuit. A control signal indicates to the integrated circuit that a TAB test mode of operation is in effect. A second control signal indicates which of the two output signals should be enabled to the shared test pad during the TAB test mode. Multiplexers are provided at the output terminals, and are responsive to such control signals, for selectively allowing one of such output signals to be conducted to the test pad, while temporarily presenting a high impedance at the other output terminal. A method of testing such integrated circuit assembly includes the step of trimming such test pads from the tape automated bonding film after testing and before surface mounting.

1 Claim, 3 Drawing Sheets

REDUCED OUTPUT TEST CONFIGURATION FOR TAPE AUTOMATED BONDING

BACKGROUND OF THE INVENTION

1. Field of the Invention

The present invention relates generally to high density integrated circuits bonded to a plastic film using a technique known as tape automated bonding (or TAB), and more particularly to an apparatus and method for reducing the number of test pads required on such plastic film in order to test such integrated circuit.

2. Description of the Related Art

Integrated circuits formed upon semiconductor dies are often die-bonded to a ceramic carrier for purposes of packaging and interconnection to a printed circuit board. Such ceramic carriers typically have a leadframe used to make electrical contact to the various input, output, and power terminals of the integrated circuit. Such integrated circuits are provided with wire bond pads along the periphery of the integrated circuit, and individual wire bonds are applied between each wire bond pad and the leadframe to effect such electrical connections.

However, high-interconnection density integrated circuits having large numbers of input and output connections can not be suitably packaged in such ceramic carriers due to practical limitations on the number of leads in such leadframes. To overcome such limitations, a process known as tape automated bonding (or TAB) has been used to make electrical connection with the input and output terminals of high pin count integrated circuits. In tape automated bonding, metal conductors are formed upon a supporting plastic tape film and are mass-bonded to the integrated circuit in a single operation. Such conductors may be, for example, etched copper leads plated with gold, supported by a polyamide plastic film.

The resulting assembly offers shorter interconnect paths and can achieve better electrical performance and obtain higher density of interconnections than the wirebonding process described in the previous paragraph. In addition, the resulting assembly has a lower profile than conventional ceramic carriers that rely upon wirebonding. Tape automated bonding also provides a form of packaging that is relatively thin and light, and the resulting assembly can be surface mounted to printed circuit cards, multichip modules, and flex cables. Accordingly, tape automated bonding is often the technology of choice for packaging liquid crystal display (LCD) driver chips. Tape automated bonding has been used in conjunction with integrated circuit chips for such high-volume consumer applications as calculators and electronic organizers.

Tape automated bonding films are typically provided on spools and are available in a variety of tape widths. Generally speaking, the wider the tape film, the higher the cost of the tape film and the resulting integrated circuit assembly. Thus, integrated circuit manufacturers desire to use the narrowest width tape film possible to lower assembly costs.

One challenge which arises when using tape automated bonding is the need for integrated circuit manufacturers to test such packaged integrated circuits for proper operation before they are shipped. Testing requires access to each of the input and output conductors on the tape film in order to drive and/or sense the corresponding terminals on the integrated circuit chip. Such access is typically provided by forming enlarged test pads along the periphery of the tape film and connecting such test pads to the series of corresponding conductors etched on the tape film. Such test pads are necessarily of greater dimension than the width of the interconnecting conductors etched on the tape film to allow probes on a test head to make reliable contact with such test pads. Testing is then performed by lowering a test head onto the tape automated bonding assembly; the test head includes probes equal in number to the test pads for temporarily contacting such test pads to run a series of electrical tests in order to verify that the output signals generated by the integrated circuit are as expected. Following such testing, such integrated circuits are excised from the tape film, either by the semiconductor manufacturer or by the customer, for allowing such integrated circuit assembly to be surface mounted to a circuit board or the like. Excising is a process by which the outer periphery of the tape film (including tape film sprocket holes and TAB test pads) is trimmed away.

For liquid crystal display driver integrated circuits, the number of outputs usually far exceeds the number of inputs, and each such output requires a test pad on the tape film for complete functional testing of the packaged integrated circuit. Since the dimensions of the test pads are larger than the dimensions of the conductors to which they are attached, the disturbing situation can arise wherein the width of the tape film is actually dictated by the number of test pads required, even though such test pads may ultimately be trimmed from the tape film following testing. Moreover, as the number of test pads increases due to increasing numbers of outputs, the pincount of the test head must also increase, further complicating testing procedures.

Accordingly, it is an object of the present invention to provide an integrated circuit assembly using tape automated bonding techniques wherein the number of test pads required to perform full functional testing is actually less than the number of outputs generated by the integrated circuit.

Another object of the present invention is to provide such an integrated circuit assembly which reduces the dimensions of the tape film which would otherwise be required to accommodate testing of the integrated circuit.

Still another object of the present invention is to provide a method of testing a high output pin TAB integrated circuit which method uses a smaller number of test pads than is currently required.

A further object of the present invention is to provide a method of testing such a high output pin TAB integrated circuit which method uses a lower pin count test head than would otherwise be required.

These and other objects of the present invention will become more apparent to those skilled in the art as the description of the present invention proceeds.

SUMMARY OF THE INVENTION

Briefly described, and in accordance with the preferred embodiment thereof, the present invention is an integrated circuit assembly formed upon a semiconductor chip and mounted to a tape automated bonding film wherein a first circuit and second circuit are each formed upon the semiconductor chip, each of the first and second circuits having an output terminal for providing first and second output signals. The integrated circuit assembly also includes first and second multiplexers formed upon the semiconductor chip for receiving the first and second output signals, respectively, and providing first and second multiplexed output signals, respectively. The integrated circuit assembly further includes a test pad formed upon the tape automated bonding film to facilitate testing of the first and second output signals before the integrated circuit assembly is excised from the tape film and surface-mounted to a printed circuit card or the like. The test pad is initially shorted to the output terminals of both the first and second multiplexers for receiving both of the first and second multiplexed output signals.

The integrated circuit assembly further includes a first control terminal for receiving a first control signal that indicates whether the integrated circuit is in a normal mode of operation (once testing is completed, and the integrated circuit assembly is surface-mounted) or in a test mode of operation prior to surface mounting. The integrated circuit also includes a second control terminal for receiving a second control signal which indicates during the test mode of operation whether the first output signal or the second output signal is to be directed to the test pad. The first and second multiplexers are responsive to the first and second control signals for distinguishing normal mode from test mode, and for selecting one, but not both, of the first and second output signals to the test pad during test mode. The multiplexer associated with the unselected output signal provides a high output impedance to avoid interference with the selected output signal.

During the aforementioned test mode, first and second conductors formed upon the tape automated bonding film serve to couple the output terminals of the first and second multiplexers to the test pad, respectively. The integrated circuit assembly may include a third circuit formed upon the semiconductor chip for providing a third output signal. Likewise, a third conductor is formed upon the tape automated bonding film for selectively coupling the third output signal to a different test pad; this third conductor is preferably disposed between the first and second conductors in order to prevent two such conductors which share the same test pad from extending adjacent to one another on the tape automated bonding film.

The present invention also includes a method of testing an integrated circuit assembly formed upon a semiconductor chip that is mounted to a tape automated bonding film, before such integrated circuit assembly is surface-mounted. The method of the present invention includes the step of providing a test pad on the tape automated bonding film for use in testing at least first and second output signals. The method also includes the step of providing a first control signal to distinguish a normal mode of operation of the integrated circuit from a test mode. A second control signal is also provided to select either the first output signal or the second output signal to the test pad during the test mode of operation. The method includes the step of responding to the second control signal during test mode to alternately couple the first output signal to the test pad while decoupling the second output signal from the test pad, and then coupling the second output signal to the test pad while decoupling the first output signal from the test pad, thereby allowing tests of the first and second output signals using the same test pad. The test pad is preferably located on a peripheral portion of the tape automated bonding film, and the method includes the further step of trimming such test pad from the integrated circuit assembly after testing is completed and before such integrated circuit is surface mounted.

DESCRIPTION OF THE PREFERRED EMBODIMENT

Figure 1:
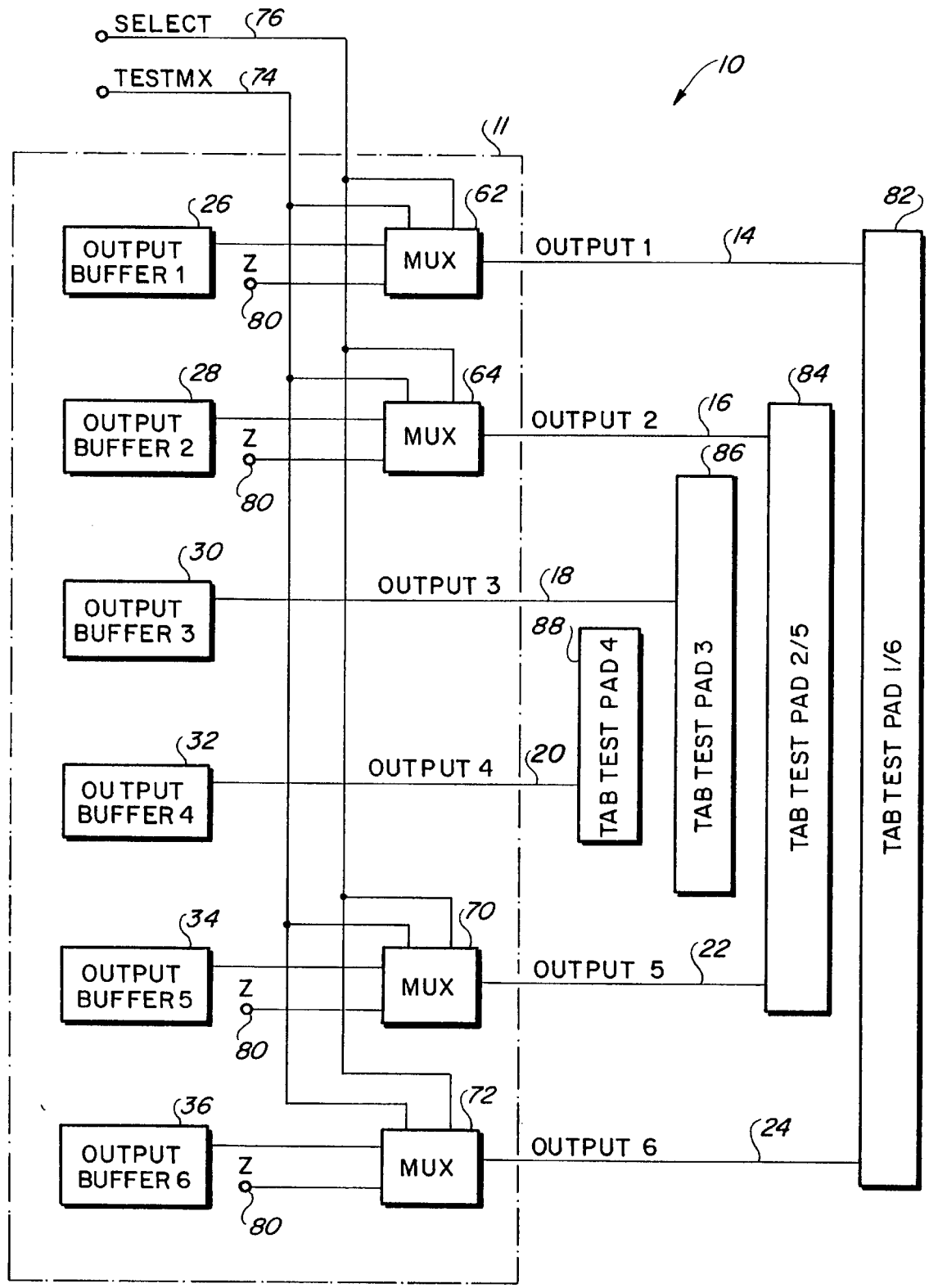
FIG. 1 is a block diagram and partial circuit schematic for an integrated circuit incorporating the present invention.

Within FIG. 1, an integrated circuit is designated generally by reference numeral 10. Integrated circuit 10 is formed upon a semiconductor chip 11 that is mounted to a tape automated bonding film 12 (see FIG. 2). Those skilled in the art are already familiar with techniques for mounting semiconductor chips to tape automated bonding films. Additional information concerning such techniques may be found in the publication by Kenzo Hatada entitled "Surface Mount Technology", published by the IEEE Press, copyright 1993, the subject matter of which is hereby incorporated by reference.

Within the example of the present invention illustrated in FIG. 1, integrated circuit 10 is a column driver circuit adapted to drive analog voltages onto the columns of a liquid crystal display (not shown) organized as a series of rows and columns. For additional information regarding the general manner in which such columns of the LCD array are driven, see U.S. Pat. No. 5,528,256, issued on Jun. 18, 1996, entitled "POWER-SAVING CIRCUIT AND METHOD FOR DRIVING LIQUID CRYSTAL DISPLAY", and assigned to the assignee of the present invention. Integrated circuit 10 includes a large number of output terminals used to drive a predetermined analog output voltage onto a column for charging such voltage onto a pixel in a selected row of the LCD array. Such output terminals include OUTPUT 1 (identified by reference numeral 14), OUTPUT 2 (identified by reference numeral 16), OUTPUT 3 (identified by reference numeral 18), OUTPUT 4 (identified by reference numeral 20), OUTPUT 5 (identified by reference numeral 22), and OUTPUT 6 (identified by reference numeral 24). While the present example assumes that such output signals are analog signals, the present invention may be used to equal advantage for integrated circuits generating a large number of digital output signals.

During a normal mode of operation of integrated circuit 10, output terminals 14–24 apply analog voltages to the columns of the LCD display (not shown). Output Buffer 1, designated by reference numeral 26, provides the particular analog voltage level to be driven onto OUTPUT 1 line 14. Likewise, Output Buffers 2–6, designated by reference numerals 28, 30, 32, 34 and 36, respectively, provide the particular analog voltage levels to be driven onto OUTPUT 2–OUTPUT 6 lines 16–24, respectively.

Output Buffer 1 circuit 26 is sometimes referred to herein as a "first circuit"; Output Buffer 1 circuit 26 includes an output terminal, and the output signal provided thereby is sometimes referred to herein as a "first output signal". Similarly, Output Buffer 6 circuit 36 is sometimes referred to herein as a "second circuit"; Output Buffer 6 circuit 36 includes an output terminal, and the output signal provided thereby is sometimes referred to herein as a "second output signal".

The output terminal of Output Buffer 1 circuit 26 is coupled to an output multiplexer 62, and serves as an input to output multiplexer 62. Likewise, the output terminal of Output Buffer 2 circuit 28 serves as an input to output multiplexer 64. In a similar fashion, output multiplexer 70 has an input terminal coupled to the output terminal of Output Buffer 5 circuit 34, and output multiplexer 72 has an input terminal coupled to the output terminal of Output Buffer 6 circuit 36. All of the circuit components 26–36, and 62–72 described thus far are formed upon the same semiconductor chip 11.

Output multiplexer 62 is sometimes referred to herein as a "first multiplexer" and includes an output coupled to OUTPUT 1 terminal 14. As will be explained below in greater detail, output multiplexer 62 can be configured to selectively provide the first output signal generated by Output Buffer 1 circuit 26 to output terminal 14. In like fashion, output multiplexer 72 is sometimes referred to herein as a "second multiplexer" and includes an output coupled to OUTPUT 6 terminal 24. As will be explained below in greater detail, output multiplexer 72 can be configured to selectively provide the second output signal generated by Output Buffer 6 circuit 36 to output terminal 24.

All of the output multiplexers 62–72 receive two control signals named TESTMX and SELECT via corresponding conductors 74 and 76, respectively. During the normal mode of operation of integrated circuit 10, control signal TESTMX is low, or logic "0". During such normal mode of operation, the SELECT control signal is ignored and has no effect upon the output signals provided by output multiplexers 62–72; thus, SELECT is essentially a "don't care" input during the normal mode of operation when TEXTMX is low.

When control signal TESTMX is high, a special TAB test mode is enabled. Thus, TESTMX may be regarded as a first control signal indicating whether integrated circuit 10 is in a normal mode of operation or in a TAB test mode of operation.

During the TAB test mode (i.e., TESTMX is high), control signal SELECT is used to determine the output of the various output multiplexers 62–72. Each of the output multiplexers 62–72 includes a third input terminal that receives a signal Z via terminal 80, indicating a high impedance. During the TAB test mode, each such output multiplexer can be controlled to provide such high impedance at its associated output terminal. For example, if SELECT is low, then output multiplexers 62 and 70 are forced to provide a high impedance at corresponding output terminals 14 and 22. On the other hand, if SELECT is high, then output multiplexers 64 and 72 are forced to provide a high impedance at corresponding output terminals 16 and 24.

The multiplexing control scheme described above allows for two output terminals, for example, OUTPUT 1 and OUTPUT 6, to share a common TAB test pad formed upon the tape automated bonding film to facilitate testing of integrated circuit 10 before integrated circuit 10 is excised from the tape film and surface mounted. For example, referring to both FIGS. 1 and 2 of the drawings, a first test pad 82 is coupled to both output terminal 14 (OUTPUT 1, or the first multiplexer output) and output terminal 24 (OUTPUT 6, or the second multiplexer output). Likewise, a second test pad 84 is coupled to both output terminal 16 (OUTPUT 2, or a third multiplexer output) and output terminal 22 (OUTPUT 5, or a fourth multiplexer output). Individual test pads 86 and 88 are preferably provided for output terminals 18 and 20 for reasons explained in greater detail below.

During the TAB test mode, when SELECT is low, output terminals 14 and 22 assume a high impedance and do not interfere with any voltage otherwise applied to test pads 82 and 84. Accordingly, the output 24 of output multiplexer 72 is coupled to TAB test pad 82, and the output 16 of output multiplexer 64 is simultaneously coupled to TAB test pad 84.

SELECT is then switched high, and output terminals 16 and 24 assume a high impedance and do not interfere with any voltage otherwise applied to test pads 82 and 84. Accordingly, the output 14 of output multiplexer 62 is enabled to TAB test pad 82, and the output 22 of output multiplexer 70 is enabled to TAB test pad 84.

In the above-described manner, two TAB test pads (82 and 84) can be used to fully test four different output terminals (14, 16, 22, 24), thereby reducing the number of separate TAB test pads that would otherwise be required to fully test integrated circuit 10 following Tape Automated Bonding (TAB) procedures. Preferably, all of the test pads 82–88 are located on a peripheral portion of the tape automated bonding film 12. Following the testing of integrated circuit 10 in the manner described above, the peripheral portion of tape automated bonding film 12 is simply trimmed away, or excised, by the manufacturer, or by the customer, and the TAB test pads 82, 84, 86 and 88 are thereby severed from integrated circuit 10, leaving only conductors that can be interconnected using known surface mounting techniques; thus, during normal circuit operation, TAB test pad 82 no longer shorts output terminals 14 and 24, and TAB test pad 84 no longer shorts output terminals 16 and 22.

Figure 2:
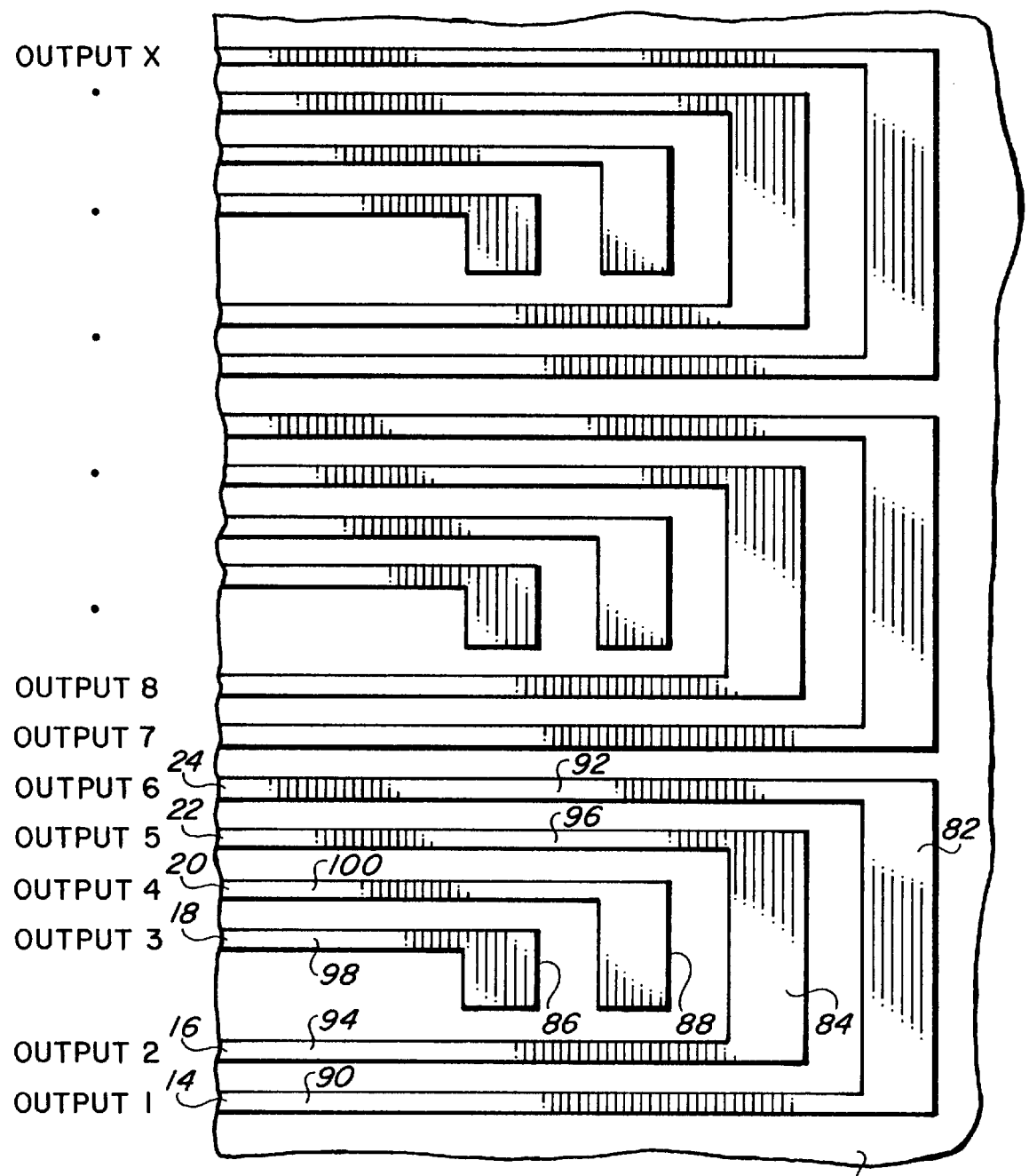
FIG. 2 is an enlarged view of the test pads formed upon a tape automated bonding film to facilitate testing of the integrated circuit of FIG. 1.

As indicated above, output terminals 18 and 20 are not shorted to the same TAB test pad; rather, two separate test pads, 86 and 88 are provided. Referring to FIG. 2, output terminal 14 extends along a first conductor 90 formed upon tape automated bonding film 12 toward test pad 82, while output terminal 24 extends along a second conductor 92. These two conductors 90 and 92 do not lie adjacent to each other on the tape automated bonding film 12 until reaching test pad 82. Likewise, output terminal 16 extends along a third conductor 94 and output terminal 22 extends along a fourth conductor 96. These two conductors 94 and 96 do not lie adjacent to each other on the tape automated bonding film 12 until reaching test pad 84; they are separated from each other by additional conductors (98, 100) that are disposed between conductors 94 and 96 on film 12. Conductors that do not lie adjacent to each other on tape automated bonding film 12 are less likely to be shorted to each other by errors in assembly of the semiconductor chip to the film 12. In contrast, output terminals 18 and 20 extend along conductors 98 and 100, which do lie adjacent one another, and which may become shorted to each other by reason of an error in assembly. In order to more readily detect such shorting problems, conductors that lie adjacent to one another on the tape automated bonding film are not permitted to share a common test pad.

The steps described above for testing the output terminals also set forth a method of testing an integrated circuit formed upon a semiconductor chip mounted to a tape automated bonding film before such integrated circuit is surface mounted. This method includes the steps of providing at least one test pad, such as test pad 82, on the tape automated bonding film 12 for use in testing both a first output signal (the output 14 of output multiplexer 62) and a second output signal (the output 24 of output multiplexer 72). The method includes the step of providing a first control signal, such as TESTMX, to distinguish a normal mode of operation of the integrated circuit from a test mode of operation. The method also includes the step of providing at least a second control signal, such as SELECT, having first and second states to select either the first output signal (output terminal 14) or a second output signal (output terminal 24) to the test pad 82 during the test mode of operation. During test mode, when the second control signal (SELECT) is in its first state (e.g., high), the first output signal (output 14) is conducted to test pad 82, and the second output signal (output 24) is decoupled from test pad 82. On the other hand, during test mode, when the second control signal (SELECT) is in its second state (e.g., low), the first output signal (output 14) is decoupled from test pad 82, and the second output signal (output 24) is conducted to test pad 82.

Figure 3:
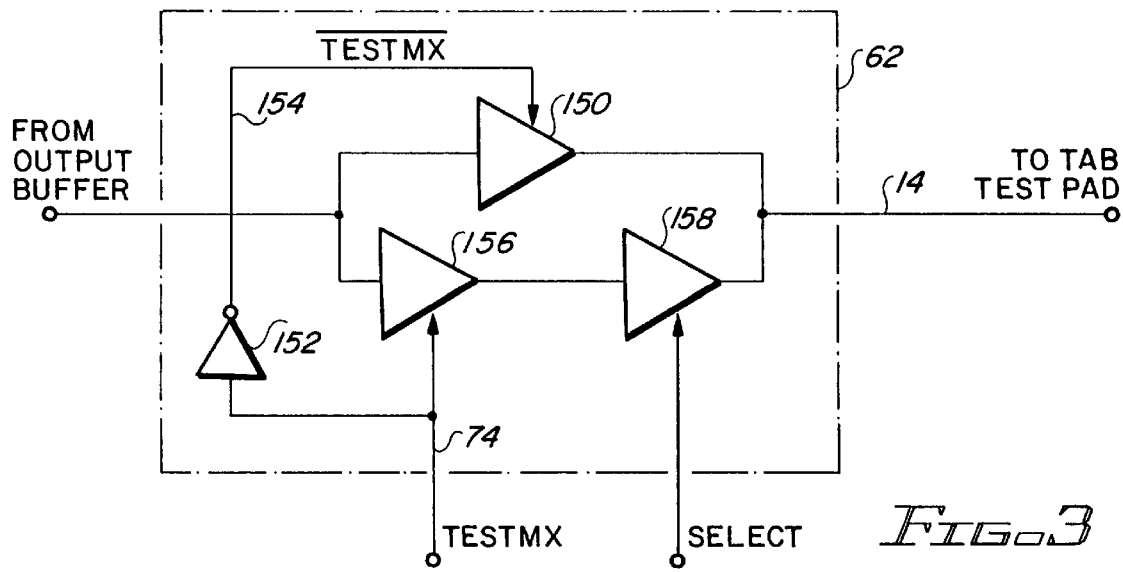
FIG. 3 is a block diagram schematically indicating the contents of one of the multiplexers shown in FIG. 1.

FIG. 3 illustrates one possible configuration for the output multiplexers shown in FIG. 1. For example, output multiplexer 62 may include a first transmission gate 150 that freely passes the output of Output Buffer 1 circuit 26 to output terminal 14 during the normal mode of operation. Control signal 74 (TESTMX) is inverted by inverter 152 to provide $\overline{TESTMX}$ on conductor 154. When TESTMX is low, $\overline{TESTMX}$ is high, and transmission gate 150 is enabled, thereby passing the output of Output Buffer 1 circuit 26 to output terminal 14. Conversely, when TESTMX is high, $\overline{TESTMX}$ is low, and transmission gate 150 is disabled, causing a high impedance to appear at the output of transmission gate 150.

Output multiplexer 62 also includes a second transmission gate 156 controlled by TESTMX; when TESTMX is low (normal mode), transmission gate 156 is disabled, and the output of transmission gate 156 is a high impedance. However, when TESTMX is high (TAB test mode), transmission gate 156 is enabled, and the output of Output Buffer 1 circuit 26 is transmitted to the output of transmission gate 156. A third transmission gate 158 is coupled in series between transmission gate 156 and output terminal 14. Transmission gate 158 is controlled by control signal SELECT. When SELECT is high, and transmission gate 158 is enabled, thereby passing the output of transmission gate 156 to output terminal 14; incidentally, it will be noted that the signal passed by transmission gate 160 will be a high impedance if TESTMX is low, but will be the output of Output Buffer 1 circuit 26 if TESTMX is high. On the other hand, if SELECT is low, then transmission gate 158 will be disabled, forcing the output of transmission gate 158 to a high impedance. The configuration for output multiplexer 72 is similar to that just described for output multiplexer 62, except that control signal SELECT is complemented to form $\overline{SELECT}$, and $\overline{SELECT}$ is used to drive the third transmission gate.

Those skilled in the art will now appreciate that an improved integrated assembly using tape automated bonding has been described wherein the number of test pads required to perform full functional testing prior excising/ surface mounting can be significantly less than the number of outputs generated by the integrated circuit. For example, as indicated on FIG. 2, the test pad configuration described in conjunction with OUTPUT 1 through OUTPUT 6 can be repeated for each further group of output terminals. As it is not uncommon for an LCD column driver integrated circuit to have as many as 384 outputs to drive 384 columns, the use of only four test pads to test every six output terminals results in a reduction from 384 test pads to 256 test pads, or only two-thirds as many as would otherwise be required. Such a large reduction in the number of TAB test pads can actually reduce the dimensions of the tape film which would otherwise be required to accommodate testing of the integrated circuit. In addition, it will be appreciated that the integrated circuit assembly and test method described herein allow for testing of high output pin TAB integrated circuits using a lower pin count test head than would otherwise be required. As the additional circuitry needed to implement output multiplexers 62–72 on semiconductor chip 11 requires relatively chip real estate, the increase in size of semiconductor chip 11 to provide such additional circuitry is essentially insignificant.

Figure 4:
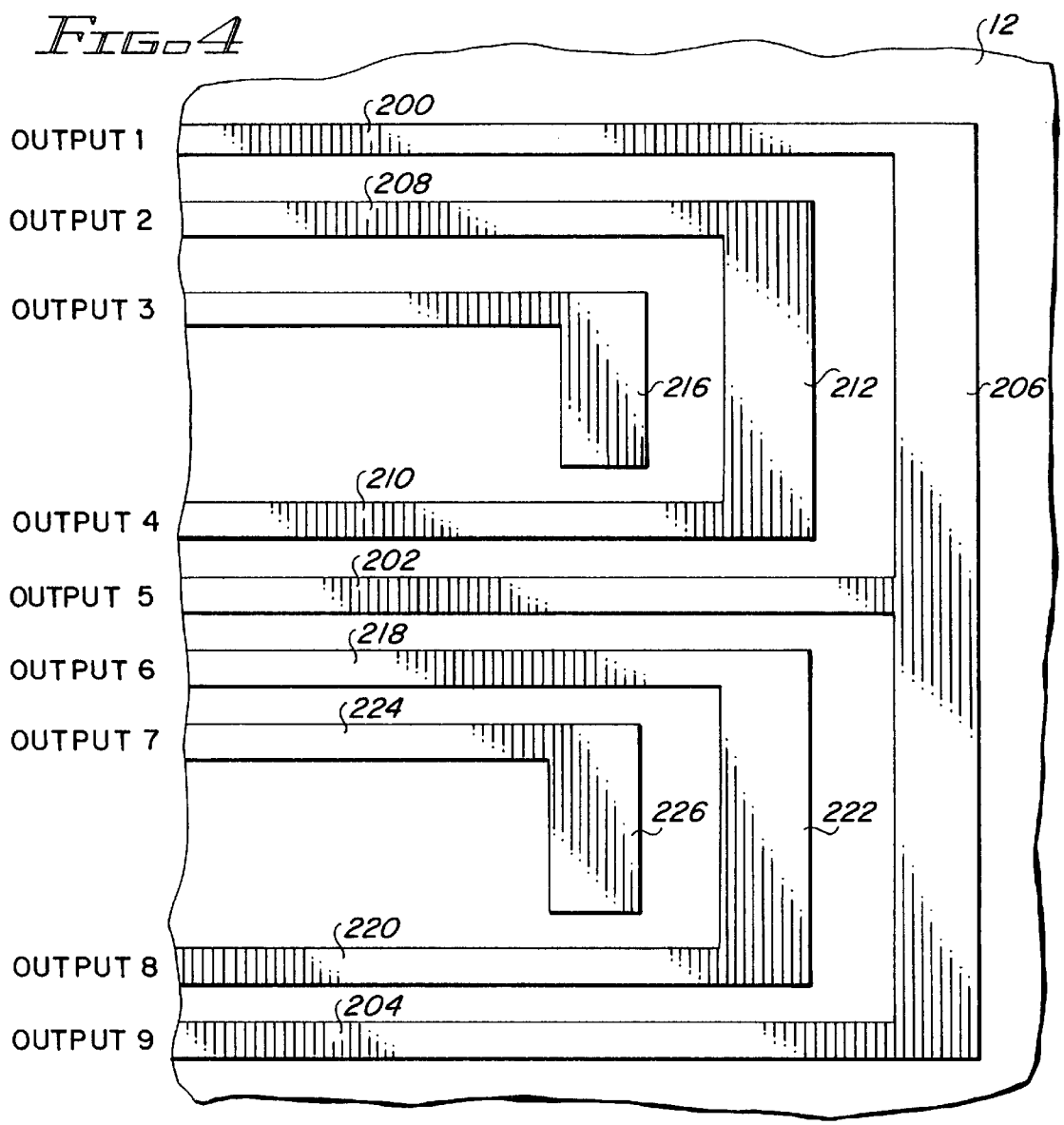
FIG. 4 is an enlarged view of the test pads formed in an alternate embodiment of the present invention wherein three output circuits share the same TAB test pad.

While the present invention has been described with respect to a preferred embodiment thereof, such description is for illustrative purposes only, and is not to be construed as limiting the scope of the invention. For example, in FIG. 4, an alternate embodiment is illustrated wherein three output signals share the same TAB test pad. In FIG. 4, OUTPUT 1, OUTPUT 5 and OUTPUT 9 are coupled by conductors 200, 202 and 204 to shared TAB test pad 206. OUTPUT 2 and OUTPUT 4 are coupled by conductors 208 and 210 to shared TAB test pad 212. OUTPUT 3 is coupled by conductor 214 to its own TAB test pad 216. OUTPUT 6 and OUTPUT 8 are coupled by conductors 218 and 220 to shared TAB test pad 222. OUTPUT 7 is coupled by conductor 224 to its own TAB test pad 226. The output multiplexers associated with OUTPUT 2 and OUTPUT 4, and associated with OUTPUT 6 and OUTPUT 8, may be of the same type previously described. However, the output multiplexers associated with OUTPUT 1, OUTPUT 5, and OUTPUT 9 are modified to respond to three control signals, namely, TESTMX, SELECT, and SELECT2, wherein during TAB test mode, SELECT and SELECT2 can specify three different states to select one of the three possible output signals to shared TAB test pad 206.

The implementation illustrated in FIG. 4 has the potential to reduce the number of required TAB test pads for every nine output signals from nine to five, thereby lessening the number of TAB test pads to approximately 56% of the number normally required.

Various other modifications and changes may be made to the described embodiment by those skilled in the art without departing from the true spirit and scope of the invention as defined by the appended claims.

We claim:

1. An integrated circuit formed upon a semiconductor chip mounted to a tape automated bonding film, comprising in combination:

a. a first circuit formed upon said semiconductor chip, said first circuit having a first circuit output terminal for providing a first output signal;

b. a second circuit formed upon said semiconductor chip, said second circuit having a second circuit output terminal for providing a second output signal;

c. a third circuit formed upon said semiconductor chip, said third circuit having a third circuit output terminal for providing a third output signal;

d. a first multiplexer formed upon said semiconductor chip, said first multiplexer having an input coupled to said first circuit output terminal for receiving said first output signal, and said first multiplexer having a first multiplexer output terminal for selectively providing said first output signal;

e. a second multiplexer formed upon said semiconductor chip, said second multiplexer having an input coupled to said second circuit output terminal for receiving said second output signal, and said second multiplexer having a second multiplexer output terminal for selectively providing said second output signal;

f. a first test pad formed upon said tape automated bonding film to facilitate testing of said integrated circuit before said integrated circuit is bonded to a carrier;

g. a second test pad formed upon said tape automated bonding film to facilitate testing of said integrated circuit before said integrated circuit is bonded to a carrier;
h. a first conductor formed upon said tape automated bonding film for coupling said first multiplexer output terminal to said first test pad;
i. a second conductor formed upon said tape automated bonding film for coupling said second multiplexer output terminal to said first test pad;
j. a first control terminal for receiving a first control signal, said first control signal indicating whether the integrated circuit is in a normal mode of operation or in a test mode of operation;
k. a second control terminal for receiving a second control signal having at least first and second states, the first state of said second control signal serving to indicate during the test mode of operation that the first circuit output signal is to be directed to said first test pad, the second state of said second control signal serving to indicate during the test mode of operation that the second circuit output signal is to be directed to said first test pad;
l. said first multiplexer being responsive to said first and second control signals for providing the first circuit output signal to the first multiplexer output terminal, and hence to said first test pad, when the first control signal indicates the test mode of operation and the second control signal is in the first state, and for providing a high impedance to the first multiplexer output terminal when the first control signal indicates the test mode of operation and the second control signal is in the second state;
m. said second multiplexer being responsive to said first and second control signals for providing a high impedance to the second multiplexer output terminal when the first control signal indicates the test mode of operation and the second control signal is in the first state, and for providing the second circuit output signal to the second multiplexer output terminal, and hence to said first test pad, when the first control signal indicates the test mode of operation and the second control signal is in the second state; and
n. a third conductor formed upon said tape automated bonding film for coupling said third circuit output terminal to said second test pad, said third conductor being disposed between said first conductor and said second conductor.

* * * * *